US012680157B2

(12) United States Patent
Ohtaki et al.

(10) Patent No.: US 12,680,157 B2
(45) Date of Patent: Jul. 14, 2026

(54) FILM FORMATION CONTROL DEVICE, FILM FORMATION DEVICE AND FILM FORMATION METHOD

(71) Applicant: Shincron Co., Ltd., Kanagawa (JP)

(72) Inventors: Yoshiyuki Ohtaki, Kanagawa (JP); Takayuki Matsudaira, Kanagawa (JP); Takeshi Yamaguchi, Kanagawa (JP); Mitsuhiro Miyauchi, Kanagawa (JP)

(73) Assignee: Shincron Co., Ltd., Kanagawa (JP)

( * ) Notice: Subject to any disclaimer, the term of this patent is extended or adjusted under 35 U.S.C. 154(b) by 72 days.

(21) Appl. No.: 18/252,160

(22) PCT Filed: Feb. 4, 2022

(86) PCT No.: PCT/JP2022/004474
§ 371 (c)(1),
(2) Date: May 8, 2023

(87) PCT Pub. No.: WO2023/079770
PCT Pub. Date: May 11, 2023

(65) Prior Publication Data
US 2024/0368751 A1 Nov. 7, 2024

(30) Foreign Application Priority Data

Nov. 8, 2021 (JP) ................................. 2021-181904

(51) Int. Cl.
*C23C 14/54* (2006.01)
*C23C 14/24* (2006.01)
*C23C 14/34* (2006.01)
(52) U.S. Cl.
CPC ............ *C23C 14/547* (2013.01); *C23C 14/24* (2013.01); *C23C 14/34* (2013.01)

(58) Field of Classification Search
CPC ....... C23C 14/547; C23C 14/24; C23C 14/34; C23C 14/542; C23C 16/52; C23C 14/54
See application file for complete search history.

(56) References Cited

U.S. PATENT DOCUMENTS 6,338,775 B1    1/2002    Chen
6,863,785 B2    3/2005    Shidoji et al.
(Continued)

FOREIGN PATENT DOCUMENTS

JP    2006-028561 A    2/2006
JP    2007107053 A  *  4/2007
(Continued)

OTHER PUBLICATIONS

English translated JP-2007107053-A (Year: 2007).*
(Continued)

*Primary Examiner* — Aiden Lee
(74) *Attorney, Agent, or Firm* — MUNCY, GEISSLER, OLDS & LOWE, P.C.

(57) ABSTRACT

Provided are a light source (42) that irradiates a substrate (S) with light, the substrate being disposed on a rotating body (25); a light receiving unit (46) that receives transmitted light or reflected light, the transmitted light being emitted from the light source and transmitted through a layer of a thin film formed on the substrate, the reflected light being emitted from the light source and reflected by the layer; a positional information acquisition unit (48) that acquires positional information corresponding to a position in a circumferential direction of the rotating body; and a control unit (4) that controls a film formation condition, the control unit comprising: a timing control unit that specifies a targeted position of the substrate based on the positional information in the circumferential direction of the rotating body acquired by the positional information acquisition unit and controls timing of receiving the transmitted light or (Continued)

reflected light of the light emitted from the light source to the substrate at the specified position; a film thickness determination unit that calculates a film thickness of each layer of the thin film composed of multiple layers based on the transmitted light or reflected light received by the light receiving unit and determines a film thickness difference between the film thickness of each layer and a target film thickness of each layer constituting the thin film having a desired spectral characteristic; and a film formation condition setting unit that, when the film thickness of each layer has the film thickness difference of a predetermined value or more with respect to the target film thickness, corrects the film formation condition for the layer having the film thickness difference so that the film thickness of the layer becomes the target film thickness, and then sets the film formation condition.

7 Claims, 8 Drawing Sheets

(56) References Cited

U.S. PATENT DOCUMENTS

| | | | |
|---|---|---|---|
| 7,828,929 | B2 | 11/2010 | Lee et al. |
| 2010/0055312 | A1* | 3/2010 | Kato ................. C23C 16/45508 |
| | | | 118/668 |
| 2013/0038883 | A1* | 2/2013 | Yamazaki ............ G01N 21/211 |
| | | | 356/630 |
| 2013/0081942 | A1 | 4/2013 | Hinata et al. |
| 2016/0223712 | A1 | 8/2016 | Price et al. |
| 2016/0298230 | A1 | 10/2016 | Perkins et al. |
| 2017/0102321 | A1* | 4/2017 | Mizuguchi ......... G01N 21/8422 |
| 2019/0390321 | A1 | 12/2019 | Murotani et al. |
| 2021/0002756 | A1 | 1/2021 | Tilsch et al. |
| 2021/0164092 | A1 | 6/2021 | Vergohl et al. |

FOREIGN PATENT DOCUMENTS

| | | | |
|---|---|---|---|
| JP | 2007231303 | A | 9/2007 |
| JP | 2010087467 | A | 4/2010 |
| JP | 201466536 | A | 4/2014 |
| JP | B005938155 | | 6/2016 |
| KR | 20040074093 | A | 8/2004 |
| WO | WO 2016/003400 | A1 | 1/2016 |

OTHER PUBLICATIONS

Korean Office Action in application No. 10-2023-7013664 dated Mar. 26, 2025 and its English translation; pp. 1-14.

The English translation of the International Search Report previously submitted in the present application on May 8, 2023 cited in counterpart PCT application No. PCT/JP2022/004474, dated Mar. 3, 2022, 2 pages.

European Search Report corresponding to App. No. PCT/JP2022004474, Apr. 8, 2026, 11 pages.

* cited by examiner

FIG. 3A
FIG. 3B
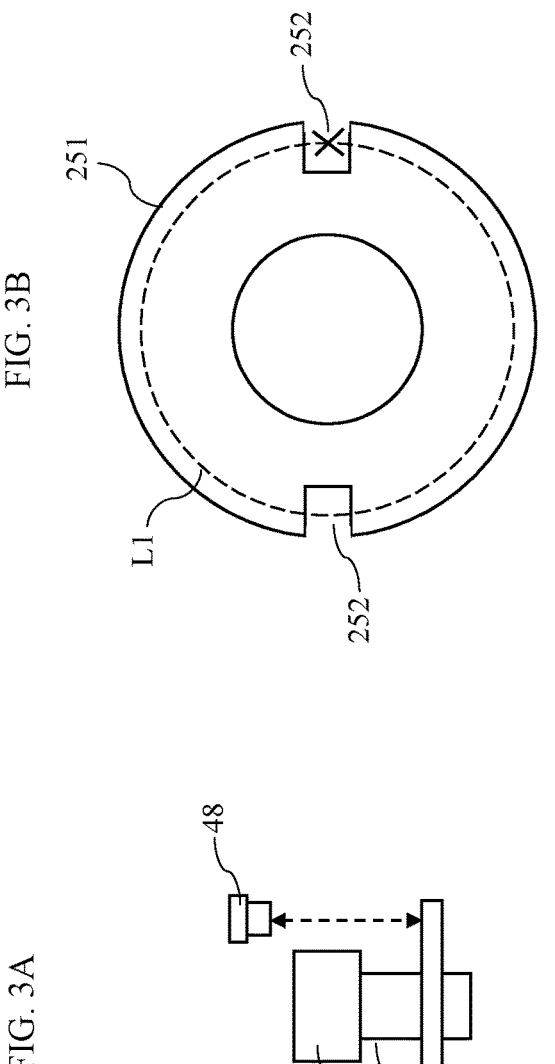
FIG. 3C
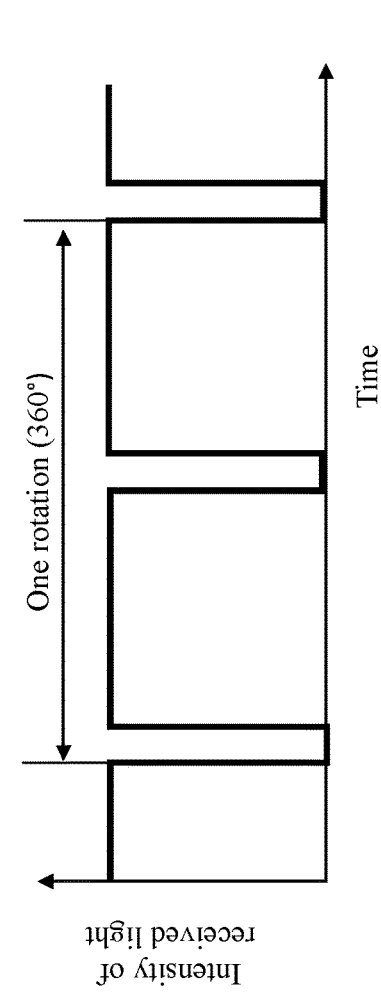

FIG. 7

At the time of N-th film formation

| No. of layer | Film formation material | Target film thickness [nm] | Analyzed film thicknesses [nm] | Analysis result [%] | Current feedback coefficient | New feedback coefficient |
|---|---|---|---|---|---|---|
| 1 | SiO2 | 180 | 190 | 105.6 | 1 | 0.9474 |
| 2 | TiO2 | 10 | 14 | 140.0 | 1 | 0.7143 |
| 3 | SiO2 | 30 | 35 | 116.7 | 1 | 0.8571 |
| 4 | TiO2 | 60 | 65 | 108.3 | 1 | 0.9231 |
| 5 | SiO2 | 10 | 8.5 | 85.0 | 1 | 1.1765 |
| 6 | TiO2 | 40 | 43 | 107.5 | 1 | 0.9302 |
| 7 | SiO2 | 90 | 93 | 103.3 | 1 | 0.9677 |

At the time of (N+1)-th film formation

| No. of layer | Film formation material | Target film thickness [nm] | Analyzed film thicknesses [nm] | Analysis result [%] | Current feedback coefficient | New feedback coefficient |
|---|---|---|---|---|---|---|
| 1 | SiO2 | 180 | 179 | 99.4 | 0.9474 | 0.9527 |
| 2 | TiO2 | 10 | 10.5 | 105.0 | 0.7143 | 0.6803 |
| 3 | SiO2 | 30 | 29 | 96.7 | 0.8571 | 0.8867 |
| 4 | TiO2 | 60 | 61 | 101.7 | 0.9231 | 0.9079 |
| 5 | SiO2 | 10 | 9.5 | 95.0 | 1.1765 | 1.2384 |
| 6 | TiO2 | 40 | 39 | 97.5 | 0.9302 | 0.9541 |
| 7 | SiO2 | 90 | 89 | 98.9 | 0.9677 | 0.9786 |

FILM FORMATION CONTROL DEVICE, FILM FORMATION DEVICE AND FILM FORMATION METHOD

TECHNICAL FIELD

The present invention relates to a film formation control device, a film formation device and a film formation method.

BACKGROUND ART

Film formation of a thin film composed of multiple layers is performed for the surface of a substrate such as a glass, plastic or semiconductor substrate using a film formation method such as vapor deposition or sputtering. For the film formation of such a multi-layer thin film, an optical measuring device is known that measures the spectral characteristic of each layer constituting the thin film without interrupting the film formation process (Patent Document 1).

PRIOR ART DOCUMENT

Patent Document

[Patent Document 1]JP5938155B

SUMMARY OF INVENTION

Problems To Be Solved By Invention

According to the above prior art, however, while it is said that the refractive index, reflectance or extinction coefficient, for example, can be calculated from the measurement result of the spectral characteristic of each layer during the film formation, there is no mention as to how to deal with a case in which the spectral characteristic is out of an allowable range. Thus, there is a demand for a film formation control device, a film formation device and a film formation method with which it is possible to perform the film formation of a multi-layer thin film having a targeted, desired spectral characteristic.

A problem to be solved by the present invention is to provide a film formation control device, a film formation device and a film formation method with which, when performing the film formation of a multi-layer thin film, it is possible to control the film formation condition for the multi-layer thin film so as to obtain a targeted, desired spectral characteristic.

Means For Solving Problems

The present invention solves the above problem by providing:

a light source that irradiates a substrate with light, the substrate being disposed on a rotating body;

a light receiving unit that receives transmitted light or reflected light, the transmitted light being emitted from the light source and transmitted through a layer of a thin film formed on the substrate, the reflected light being emitted from the light source and reflected by the layer;

a positional information acquisition unit that acquires positional information corresponding to a position in a circumferential direction of the rotating body; and a control unit that controls a film formation condition, the control unit comprising:

a timing control unit that specifies a targeted position of the substrate based on the positional information in the circumferential direction of the rotating body acquired by the positional information acquisition unit and controls timing of receiving the transmitted light or reflected light of the light emitted from the light source to the substrate at the specified position;

a film thickness determination unit that calculates a film thickness of each layer of the thin film composed of multiple layers based on the transmitted light or reflected light received by the light receiving unit and determines a film thickness difference between the film thickness of each layer and a target film thickness of each layer constituting the thin film having a desired spectral characteristic; and a film formation condition setting unit that, when the film thickness of each layer has the film thickness difference of a predetermined value or more with respect to the target film thickness, corrects the film formation condition for the layer having the film thickness difference so that the film thickness of the layer becomes the target film thickness, and then sets the film formation condition.

Effect Of Invention

In the present invention, the spectral characteristic of each layer, such as transmittance or reflectance, is measured during the film formation without interrupting the film formation process for the multi-layer thin film, and after the film formation is completed, the film thickness of each layer is calculated from the obtained spectral characteristic. Then, when the film thickness difference from the target film thickness is large, the subsequent film formation process is performed after correcting the film formation condition so that the film thickness difference becomes small. Therefore, when performing the film formation of a multi-layer thin film, the film formation condition for the multi-layer thin film can be controlled so as to obtain the desired spectral characteristic.

BRIEF DESCRIPTION OF DRAWINGS

FIG. 2A is a plan view illustrating essential parts of a laser sensor and reflective plates of FIG. 1.

FIG. 2B is a graph illustrating the intensity of received light detected by the laser sensor when the substrate holder of FIG. 2A is rotated at a constant speed.

FIG. 3A is a front view illustrating another example of essential parts of a laser sensor and a reflective plate of FIG. 1.

FIG. 3B is a plan view of those illustrated in FIG. 3A.

FIG. 3C is a graph illustrating the intensity of received light detected by the laser sensor when the rotating shaft of FIG. 3A is rotated at a constant speed.

FIG. 7 relate to an example of the film formation process using the film formation device according to the present invention and represents a table that lists the film formation material, target film thickness, analyzed film thickness, analysis result, current feedback coefficient and new feedback coefficient of each layer at the time of N-th film formation and (N+1)-th film formation.

MODE(S) FOR CARRYING OUT THE INVENTION

Figure 1:
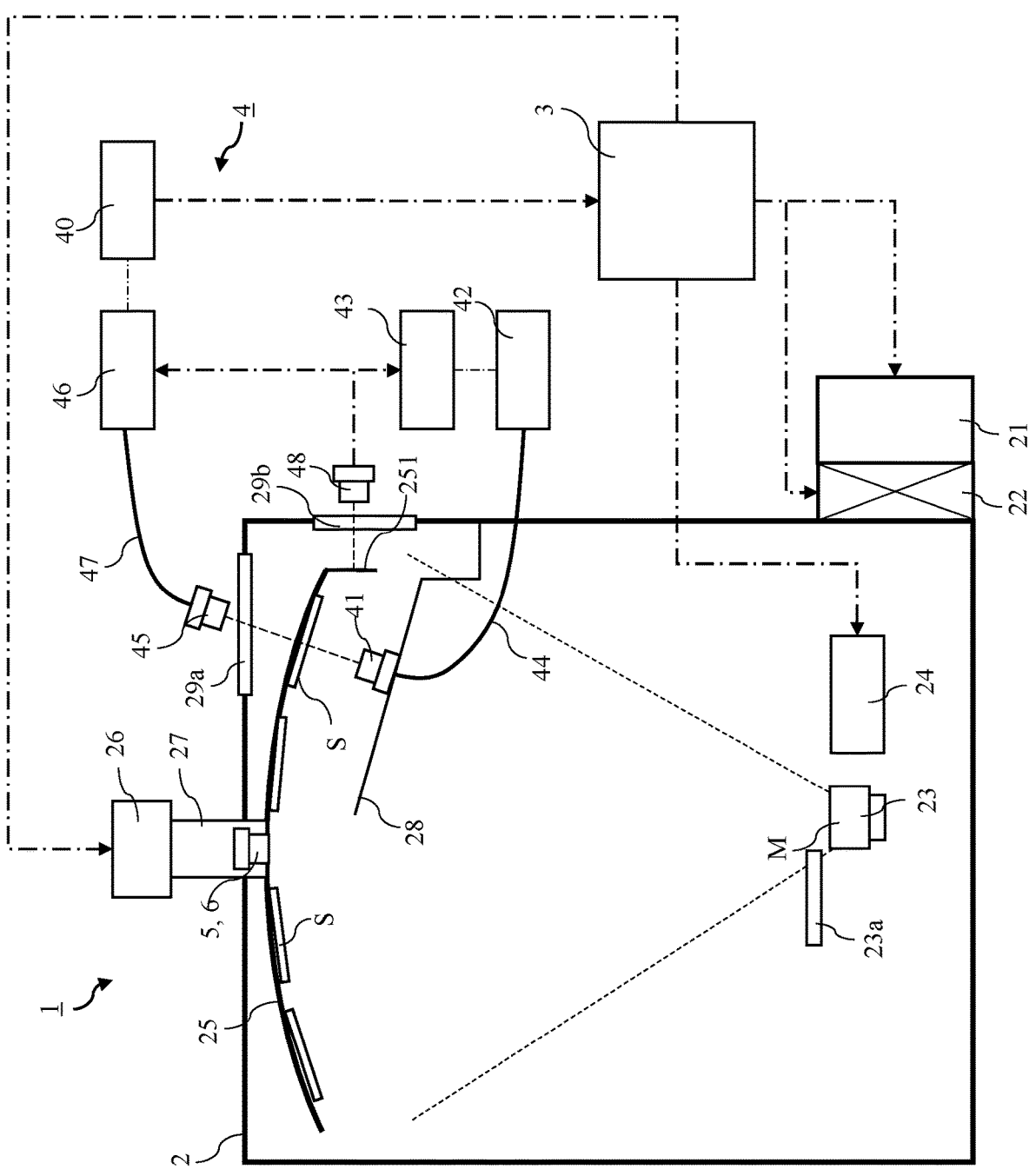
FIG. 1 is a block diagram including a vertical cross-sectional view illustrating an embodiment of a film formation device according to the present invention.

One or more embodiments of the present invention will be described below with reference to the drawings. In the following description, FIG. 1 is a diagram illustrating an embodiment of a film formation device 1 to which the film formation control device, film formation device and film formation method according to the present invention are applied, and is a block diagram including a vertical cross-sectional view of the main portion of the film formation device 1. The film formation device 1 of the present invention can typically be embodied as a vacuum vapor deposition device or a vacuum sputtering device; therefore, in the following description, the film formation device 1 using a vacuum vapor deposition method will be described as an embodiment of the present invention while the film formation device 1 using a vacuum sputtering method will be described as another embodiment of the present invention. It is, however, not intended that the film formation control device, film formation device and film formation method of the present invention are limited only to those for a vacuum vapor deposition device using a vacuum vapor deposition method and a vacuum sputtering device using a vacuum sputtering method, and the present invention can also be applied to those in a broad sense including film formation devices other than the vacuum vapor deposition device or the vacuum sputtering device.

«Vacuum Vapor Deposition Device»

The film formation device 1 of the present embodiment includes a film formation chamber 2 in which at least a film formation material (vapor deposition material) M and substrates S are provided. The film formation chamber 2 can be set to a predetermined film formation atmosphere, specifically to a degree of vacuum. The film formation chamber 2 is provided with an evacuation device 21 via a gate valve 22. By opening the gate valve 22 to evacuate the gas inside the film formation chamber 2, the inside of the film formation chamber 2 can be set, for example, to a vacuum atmosphere suitable for a vapor deposition process. As the degree of vacuum increases inside the film formation chamber 2, the mean free path of the film formation material M evaporated increases, and the evaporation temperature of the film formation material decreases, thus promoting the vapor deposition process. The evacuation device 21 and the gate valve 22 are controlled by command signals from a controller 3.

The film formation chamber 2 is provided with a substrate holder 25 that supports the substrates S such as semiconductor wafers, glass substrates and plastic substrates. The substrate holder 25 is suspended from the ceiling of the film formation chamber 2. Although not particularly limited, the substrate holder 25 of the present embodiment is composed of a plate-like member that has a concaved spherical surface such that distances between the substrates S and a hearth liner (crucible) 23 in which the film formation material M evaporates are as uniform as possible. Also although not particularly limited, the substrate holder 25 of the present embodiment is configured to be rotatable by a holder drive unit 26 composed of a motor and the like, and this configuration also contributes to an approximately uniform thickness of the films formed on respective substrates S. Furthermore, although not particularly limited, a retractable film thickness correcting plate 28 is provided between the hearth liner 23 of the film formation chamber 2 and the substrate holder 25. The film thickness correcting plate 28 interferes with the film formation material M evaporated from the hearth liner 23 to adjust the film thickness of the thin film deposited on each substrate S. The film thickness correcting plate 28 is turned up as illustrated in FIG. 1 as necessary to prevent the film formation material M from being deposited on the substrates S within a predetermined rotation angle range during one rotation. This allows the thickness of the film formed on each substrate S to be almost uniform. The holder drive unit 26 is controlled by a command signal from the controller 3 and rotates the substrate holder 25 at a set constant speed.

Although not particularly limited, the substrate holder 25 is detachably attached to a rotating shaft 27 or the like of the holder drive unit 26. When performing the film formation process, a robot (not illustrated) or the like is used to grip the substrate holder 25 loaded with a plurality of substrates S before film formation, and the substrate holder 25 is carried into the film formation chamber 2 via a load lock chamber and attached to the rotating shaft 27 of the holder drive unit 26. After the film formation process is completed, the load lock chamber is set to the same vacuum atmosphere as the film formation chamber 2, then a robot (not illustrated) or the like is used to grip the substrate holder 25 loaded with the substrates S after the film formation, and the substrate holder 25 is carried out from the film formation chamber 2 to the load lock chamber. Thus, by providing the film formation chamber 2 with the load lock chamber, it is possible to carry the substrates S into or out of the film formation chamber 2 while maintaining the vacuum atmosphere of the film formation chamber 2.

A heating source 24 is provided inside the film formation chamber 2 and heats and evaporates the film formation material M accommodated in the hearth liner 23. For the heating source 24, electron beam heating using an electron gun as well as resistance heating, high frequency induction heating and laser beam heating can be used. The heating source 24 of the embodiment illustrated in FIG. 1 adopts electron beam heating using an electron gun, and the hearth liner 23 located near the heating source 24 is irradiated with the electron beam. The opening/closing of a shutter 23a and the ON/OFF of the heating source 24 are controlled by command signals from the controller 3. When a thin film composed of multiple layers of a plurality of film formation materials M is formed as in the film formation device 1 of the present embodiment, a plurality of hearth liners 23 are provided for respective film formation materials M, and the opening/closing timing of the shutter 23a for each hearth liner 23 is controlled.

The film formation device 1 of the present embodiment includes a film formation condition controller 4. The film formation condition controller 4 of the present embodiment specifies the position of a substrate S fixed to the rotating substrate holder 25 and continuously measures, during film formation, the spectral characteristic of each layer constituting the thin film. When the spectral characteristic of the obtained thin film falls outside an allowable range after the completion of the film formation, the film formation condition controller 4 corrects the film formation condition (e.g., the film thickness) due to the spectral characteristic and then executes the next film formation process.

Figures 2A, 2B:
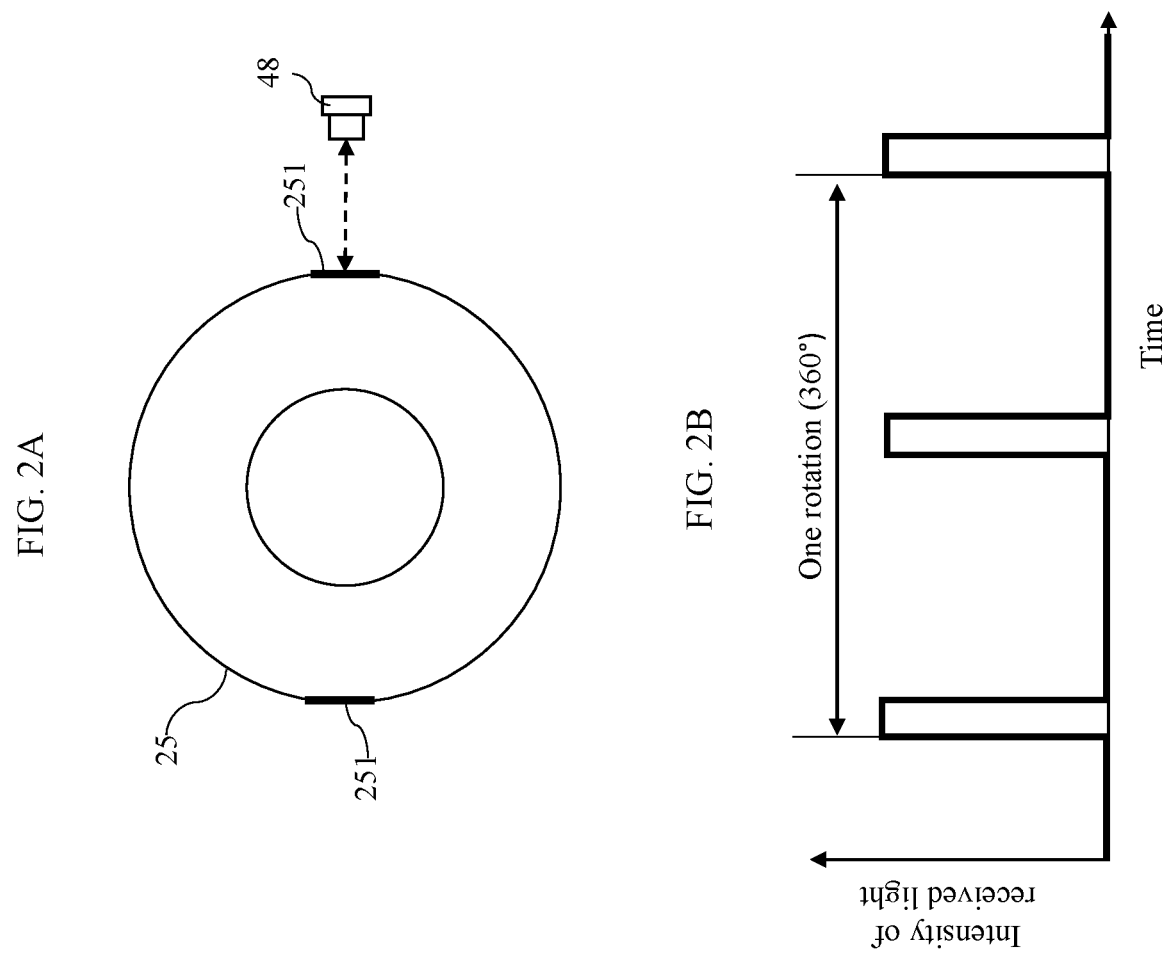

To this end, the film formation condition controller 4 of the present embodiment includes a laser sensor 48 and one or more reflective plates 251 for acquiring positional information corresponding to a position in the circumferential direction of the substrate holder 25. The laser sensor 48 and the one or more reflective plates 251 correspond to the positional information acquisition unit of the present invention. FIG. 2A is a plan view illustrating essential parts of the substrate holder 25 provided with the laser sensor 48 and the reflective plates 251. The reflective plates 251 are provided at two locations on the outer peripheral end portion of the substrate holder 25, for example, with a phase of 180°. The number of reflective plates 251 is not limited to two, and a reflective plate 251 may be provided at one location or reflective plates 251 may also be provided at three or more locations on the outer peripheral end portion of the substrate holder 25.

The laser sensor 48, which is fixed outside the film formation chamber 2, emits laser light through an observation window 29b toward the position at which a reflective plate 251 is provided, and receives the reflected light to output the intensity of received light. The laser sensor 48 may be provided inside the film formation chamber 2. FIG. 2B is a graph illustrating the intensity of received light detected by the laser sensor 48 when the substrate holder 25 is rotated at a constant speed. A predetermined intensity of received light is detected at the timing at which the laser light is reflected by the reflective plate 251, and the light receiving is not detected at other timings.

Thus, the laser light emitted from the laser sensor 48 is reflected twice by the reflective plates 251 while the substrate holder 25 rotates once, and the reflection signal is input. Provided that the positions of the reflective plates 251 on the substrate holder 25 in the circumferential direction and the mounting position of each substrate S in the circumferential direction are known and the rotation speed of the substrate holder 25 rotated by the holder drive unit 26 is a constant and known value, the position of a specific substrate S can be identified from the timing at which the laser sensor 48 detects a reflective plate 251. The detection signal from the laser sensor 48 is output to an LED power source 43 and a spectroscope 46.

The positions at which the reflective plates 251 are provided are not limited to those on the outer peripheral end portion of the substrate holder 25 as illustrated in FIGS. 1 and 2A, and the reflective plates 251 may be provided on the rotating shaft 27 because it is sufficient that the positions are sites that rotate together with the substrate holder 25. FIG. 3A is a front view illustrating a reflective plate 251 that is fixed to and rotates with the rotating shaft 27, and FIG. 3B is a plan view. The reflective plate 251 of this example is formed with two notch portions 252 on the outer peripheral portion of the reflective plate 251. The number of the notch portions 252 is not limited to two, and a notch portion 252 may be provided at one location or notch portions 252 may also be provided at three or more locations on the outer peripheral portion of the reflective plate 251.

The laser sensor 48 emits laser light toward the position at which a notch 252 is formed as illustrated in FIG. 3B and receives the reflected light thereby to output the intensity of received light. In FIG. 3B, the X mark indicates the irradiation position with the laser light from the laser sensor 48, and the dotted line indicates the irradiation trajectory with the laser light from the laser sensor 48 in association with the rotation of the rotating shaft 27. FIG. 3C is a graph illustrating the intensity of received light detected by the laser sensor 48 when the rotating shaft 27 (substrate holder 25) is rotated at a constant speed. A predetermined intensity of received light is detected at the timing at which the laser light is reflected by the reflective plate 251, whereas the light receiving is not detected at the timing at which the laser light passes through a notch 252.

Referring again to FIG. 1, in order to measure the spectral characteristic of a layer formed on a substrate S during the film formation process, the film formation condition controller 4 of the present embodiment includes an LED projector 42 (corresponding to the light source of the present invention) that irradiates the substrate S with LED light. The LED light emitted from the LED light projector 42 is guided to a light projection lens unit 41 via an optical fiber 44 and projected to the substrate S mounted at a predetermined position of the substrate holder 25. The LED projector 42 emits the LED light when supplied with power from the LED power source 43, and the LED power source 43 is turned ON/OFF at predetermined timing based on the detection signal from the above-described laser sensor 48. The projection lens unit 41 is fixed on the upper surface of the film thickness correcting plate 28 for preventing deposition of the film formation material M. The substrate holder 25 and the substrates S are composed of materials through which the LED light can pass.

The film formation condition controller 4 of the present embodiment includes a spectroscope 46 (corresponding to the light receiving unit of the present invention) that receives transmitted light passing through a layer formed on a substrate S with respect to the LED light emitted from the LED light projector 42. The LED light received by the spectroscope 46 is guided by a light receiving lens unit 45 and an optical fiber 47. The light receiving lens unit 45 of the present embodiment is fixed outside the film formation chamber 2 and receives the LED light through an observation window 29a. The light receiving lens unit 45 may be provided inside the film formation chamber 2. The detection signal from the laser sensor 48 is input to the spectroscope 46, which can therefore execute the light receiving process at the timing synchronized with the light emission timing of the above-described LED power source 43.

Figure 4:
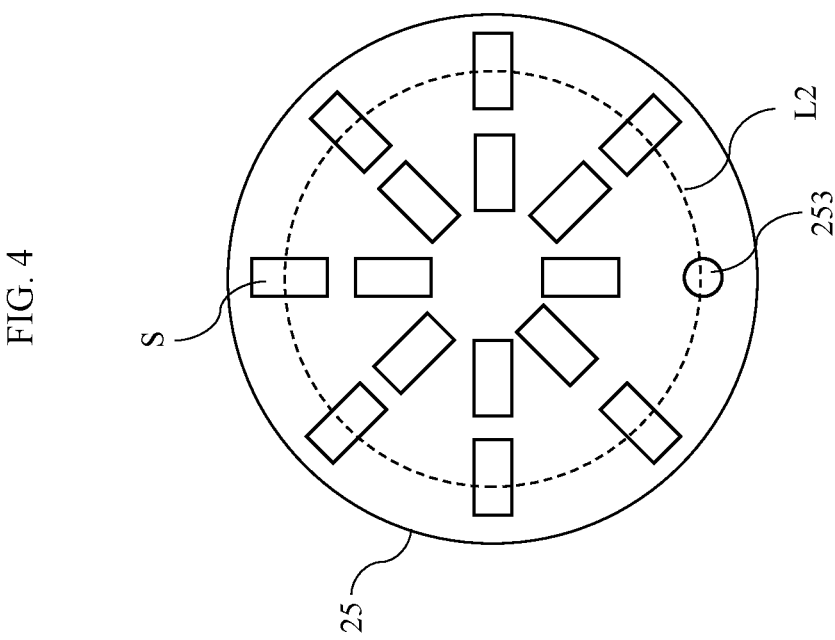
FIG. 4 is a bottom view of the substrate holder of FIG. 1, illustrating the surface on which substrates are mounted.

The spectroscope 46 outputs the intensity (spectrum) of each wavelength contained in the received, transmitted light, and the film thickness can be optically measured based on the spectrum. That is, the transmittance (ratio of transmission through an object) can be calculated from the ratio between the intensity of the received, transmitted light and the intensity of reference light (reference intensity), and the film thickness can be calculated from the calculated transmittance and a transmittance-film thickness relational expression that is preliminarily obtained. Here, the reference light is LED light emitted to a state in which the layer to be measured is not formed. FIG. 4 is a plan view (bottom view of the substrate holder 25) illustrating the surface of the substrate holder 25 on which the substrates S are mounted. As illustrated in the figure, a plurality of substrates S are fixed radially and regularly. In the figure, dotted line L2 indicates a trajectory connecting the irradiation points with the LED light emitted through the light projection lens unit 41 when the substrate holder 25 is rotated. In the present embodiment, a through-hole 253 having a diameter that allows the LED light to pass through the through-hole 253 is formed at a position on the dotted line L2 of the substrate holder 25, and the substrate S is not mounted in the through-hole 253. In this configuration, when the substrate holder 25 is rotated and the through-hole 253 reaches the irradiation position with the LED light from the light projection lens unit 41, the light receiving lens unit 45 receives the LED light which passes only through the film formation space of the film formation chamber 2 without transmitting through the layers of the thin film or the substrate S. Using this as the reference light and its intensity as the reference intensity, the transmittance is calculated.

Figure 5:
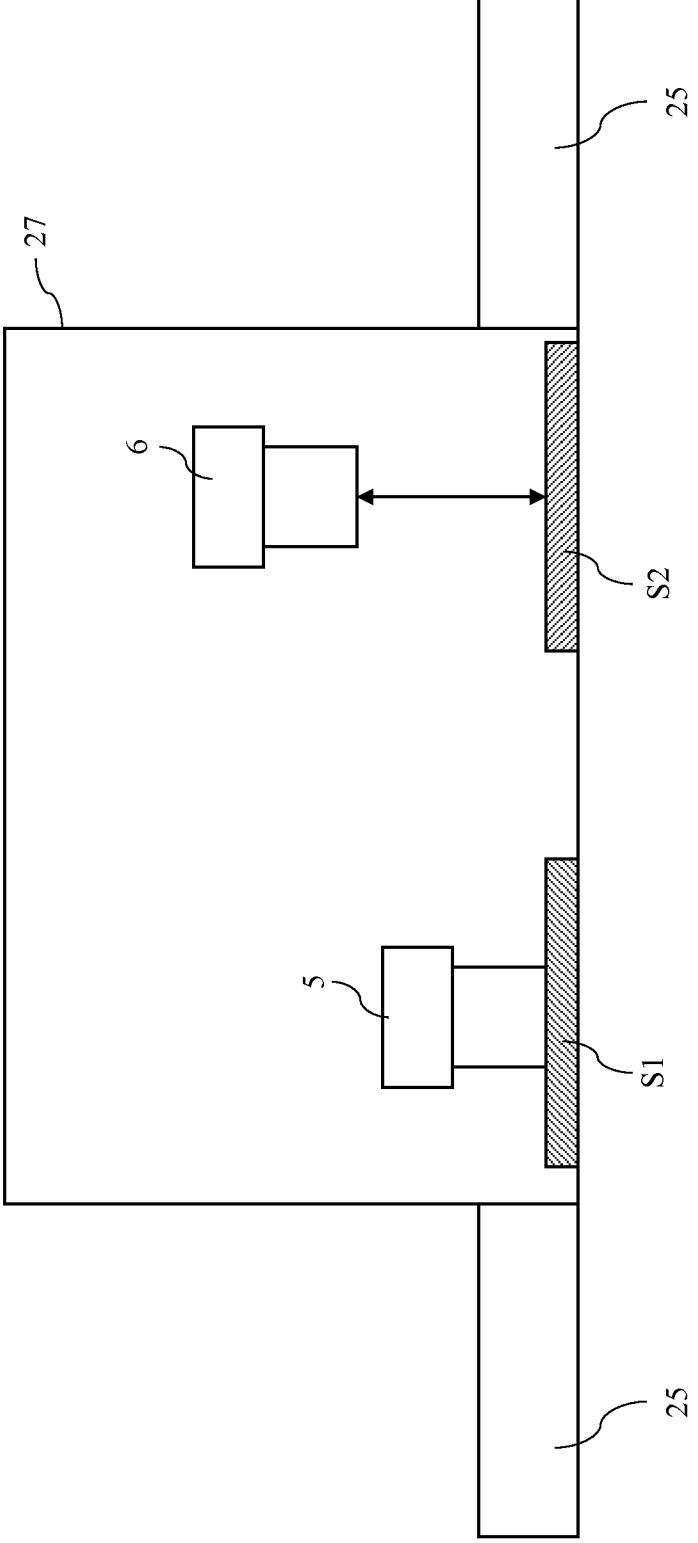
FIG. 5 is an enlarged cross-sectional view illustrating the central portion of the rotating shaft illustrated in FIG. 1, which is provided with a crystal oscillation-type film thickness meter and an optical film thickness meter.

Additionally or alternatively, characteristic values such as reflectance, refractive index and extinction coefficient can be obtained based on the intensity of the LED light received by the spectroscope 46. In the film formation device 1 of the present embodiment, the film thickness of a layer during the film formation can be not only optically measured by the film formation condition controller 4 but also measured by a crystal oscillation-type film thickness meter 5 or an optical film thickness meter 6 provided in the center or the like of the substrate holder 25. FIG. 5 is a cross-sectional view illustrating an enlarged rotating shaft 27 provided with the crystal oscillation-type film thickness meter 5 and the optical film thickness meter 6. A crystal oscillator S1 to be measured by the crystal oscillation-type film thickness meter 5 and a monitor glass substrate S2 to be measured by the optical film thickness meter 6 are attached to the lower end portion of the rotating shaft 27. During the film formation, the film formation material M evaporated from the hearth liner 23 is deposited on each of the crystal oscillator S1 and the monitor glass substrate S2.

The crystal oscillation-type film thickness meter 5 is a sensor that detects changes in the oscillation frequency of the crystal oscillator S1 thereby to measure the mass of a thin film deposited on the crystal oscillator S1, and can calculate the film thickness from the measured deposition mass and the density of the film formation material M. The optical film thickness meter 6 is for obtaining the film thickness from the reflectance, and first preliminarily measures, as the reference intensity, the intensity of the reflected light of white light that irradiates the monitor glass substrate S2 before film formation. Then, the optical film thickness meter 6 measures the intensity of the reflected light of white light that irradiates the monitor glass substrate S2 on which the thin film is deposited, calculates a relative reflectance from the ratio between the reference intensity and the measured intensity of the reflected light, and calculates the film thickness from the calculated relative reflectance and a relative reflectance-film thickness relational expression that is preliminarily set.

Referring again to FIG. 1, the film formation condition controller 4 of the present embodiment includes a film formation condition setting unit 40. The film formation condition controller 4 calculates the film thickness of each layer constituting the thin film based on the transmitted light received by the spectroscope 46 and determines a film thickness difference between the film thickness of each layer and a target film thickness of each layer constituting a thin film having a desired spectral characteristic. Then, when the film thickness of each layer has a film thickness difference of a predetermined value or more with respect to the target film thickness, the film formation condition setting unit 40 corrects the film formation condition for the layer having the film thickness difference so that the film thickness of the layer becomes the target film thickness, and then updates the film formation condition. When the film thickness of each layer does not have a film thickness difference of the predetermined value or more with respect to the target film thickness, the film formation condition setting unit 40 does not correct the film formation condition for the layer that does not have the film thickness difference, and maintains the previously set value. Furthermore, the film formation condition setting unit 40 determines whether or not the spectral characteristic (e.g., the transmittance or reflectance) of the thin film which is finally obtained by the film formation process falls within an allowable range of the desired spectral characteristic, and when determining that the measured spectral characteristic falls outside the allowable range, executes correction of the film formation condition. The film formation condition updated by the film formation condition setting unit 40 is output to the controller 3, and the next film formation process is executed in accordance with the updated film formation condition.

Figure 6:
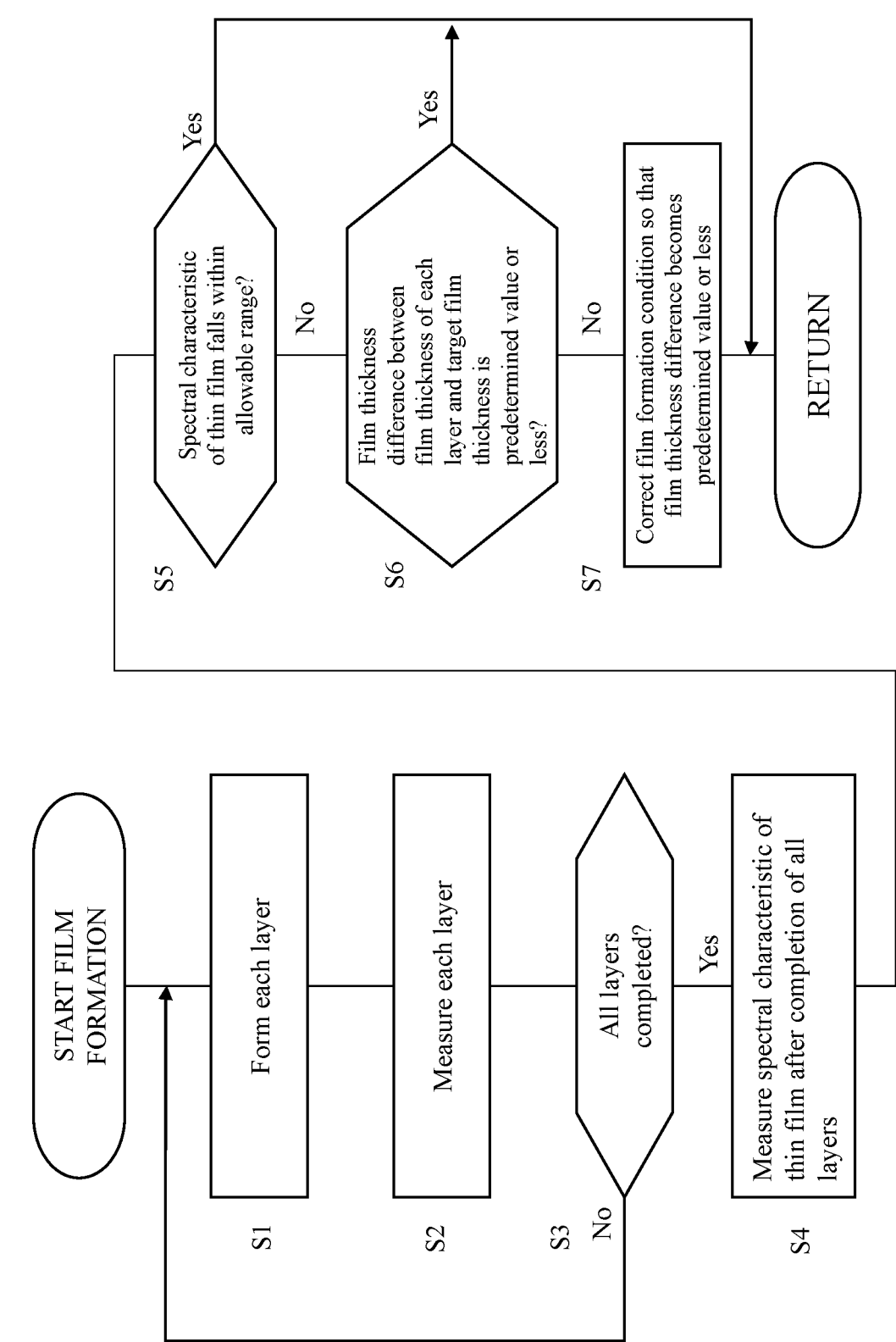
FIG. 6 is a flow chart illustrating an example of a film formation processing procedure using the film formation device according to the present invention.

The procedure of the film formation process using the film formation device 1 of the present embodiment will then be described. FIG. 6 is a flow chart illustrating an example of the procedure of the film formation process using the film formation device 1 according to the present invention. The description herein will be made for an example of alternately forming seven layers of two types of film formation materials M (SiO$_2$ and TiO$_2$). FIG. 7 represents a table that lists the film formation material, target film thickness, analyzed film thickness, analysis result (percentage of analyzed film thickness/target film thickness), current feedback coefficient and new feedback coefficient of each layer at the time of N-th film formation and (N+1)-th film formation.

Referring to FIG. 6, when the film formation process starts, the film formation of the first layer (SiO$_2$) is started in step S1, and the film thickness of the first layer is measured in step S2. In the film formation process for the first layer in step S1, the shutter 23*a* of the hearth liner 23 containing SiO$_2$ for the first layer is opened by the command signal from the controller 3, and the SiO$_2$ is heated and evaporated by the heating source 24. Along with this, the substrate holder 25 is rotated at a constant speed. This allows the first layer of SiO$_2$ to be formed on each substrate S. As listed in the upper part of FIG. 7 (at the time of N-th film formation), the target film thickness of the first layer is set to 180 nm, and therefore when the film thickness of the crystal oscillator S1 or monitor glass substrate S2 monitored by the crystal oscillation-type film thickness meter 5 or the optical film thickness meter 6 reaches the target film thickness, the shutter 23*a* is closed. Alternatively, the shutter 23*a* may be closed after the film formation time corresponding to the target film thickness of 180 nm elapses.

Then, for the actual substrate S, the film thickness of the first layer formed on the substrate S when the film formation of the first layer is completed is obtained by analyzing the transmitted light received by the spectroscope 46. As listed in the upper part of FIG. 7 (at the time of N-th film formation), if the analyzed film thickness of the first layer is 190 nm, the analysis result (defined herein as the percentage of the analyzed film thickness/target film thickness) is 105.6%.

In the subsequent step S3, a determination is made whether or not the film formation up to the seventh layer is completed, and when it is not completed, steps S1 and S2 are sequentially repeated until the film formation process for the seventh layer is completed. The upper part of FIG. 7 (at the time of N-th film formation) also lists the target film thicknesses, analyzed film thicknesses and analysis results of the second to seventh layers. In step S3 of FIG. 6, when the film formation of all the layers, that is, the film formation of up to the seventh layer, is concluded, the thin film of this example is completed, so the process proceeds to step S4, in which the spectral characteristic (e.g., the transmittance or reflectance) of the thin film is measured.

In the subsequent step S5, a determination is made whether or not the spectral characteristic of the thin film for which the film formation is completed falls within a predetermined allowable range, and when it falls within the allowable range, the current film formation condition is maintained without correction. On the other hand, when the spectral characteristic of the thin film falls outside the allowable range, the process proceeds to step S6, in which the film thickness difference between the analyzed film thickness of each layer from the first layer to the seventh layer and the target film thickness of each layer from the first layer to the seventh layer is obtained, and a determination is made whether or not it is a predetermined threshold or less. Here, the film thickness difference between the analyzed film thickness and the target film thickness may be a ratio (percentage of the analyzed film thickness/target film thickness) as listed in FIG. 7 or may also be a difference obtained by subtracting the target film thickness from the analyzed film thickness.

In step S6, when the obtained film thickness difference from the target film thickness of each layer exceeds the predetermined threshold, the process proceeds to step S7, in which the film formation condition is corrected so that the film thickness difference of the layer becomes the predetermined threshold value or less. On the other hand, when the obtained film thickness difference from the target film thickness of each layer is the predetermined threshold or less, it is considered that other factors than those of the film formation condition due to the film thickness of each layer are involved, so other measures are taken without executing the processing of step S7.

In the specific example of FIG. 7, the threshold for the analysis result in step S6 is set to 0%, and when it is other than 100%, the feedback coefficient is calculated, the calculated new feedback coefficient is set as the present feedback coefficient at the time of (N+1)-th film formation, and then the (N+1)-th film formation process is executed. In step S7, the corrected film formation condition is output to the control unit 3 and reflected in the film formation process for the substrates S of the next batch.

«Vacuum Sputtering Device»

Figure 8:
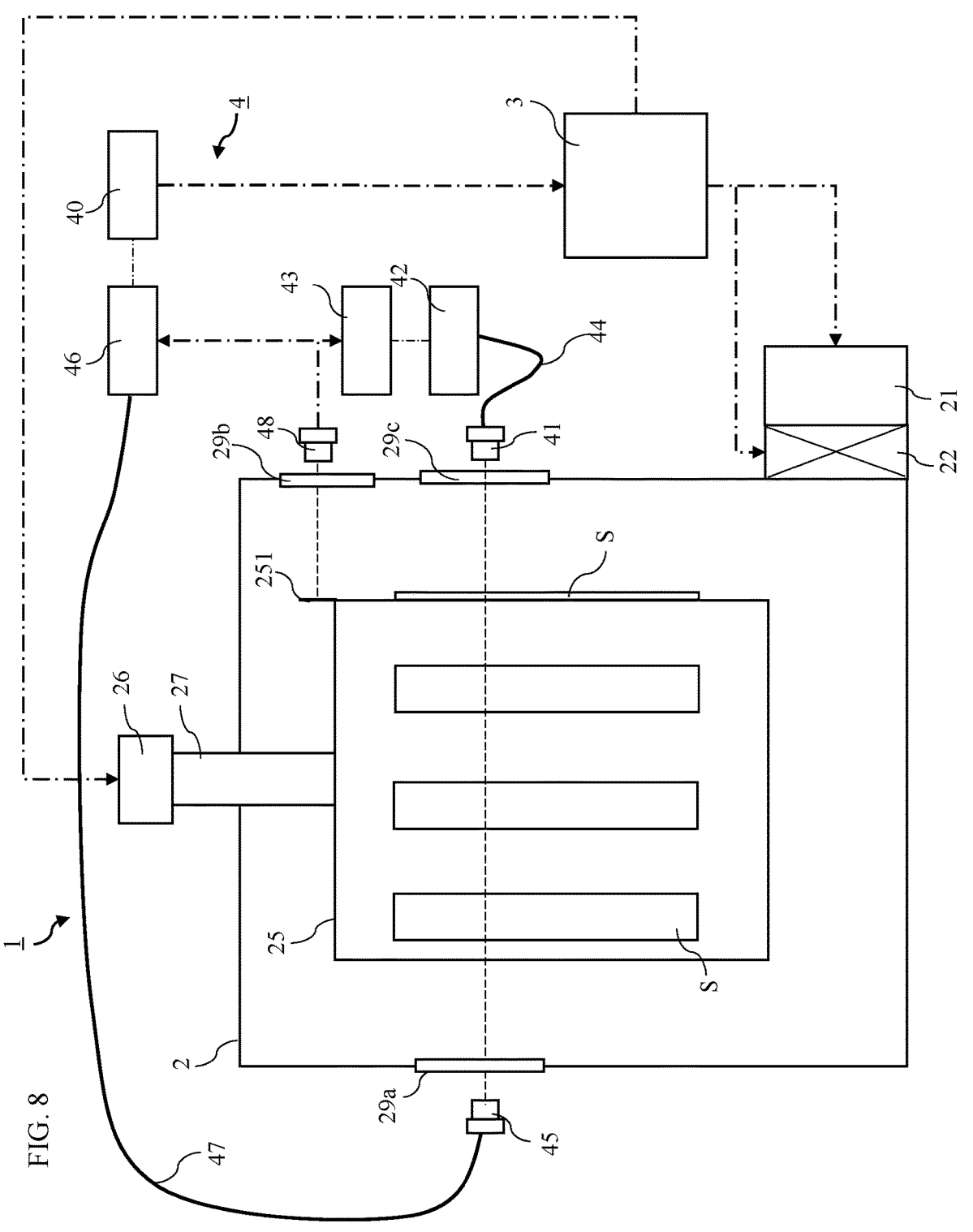
FIG. 8 is a block diagram including a vertical cross-sectional view illustrating another embodiment of a film formation device according to the present invention.

The film formation device 1 according to the present invention can be embodied as a sputtering device other than the vapor deposition device illustrated in FIG. 1. FIG. 8 is a block diagram including a vertical cross-sectional view illustrating another embodiment of the film formation device according to the present invention, which is an example applied to a vacuum sputtering device. Members common to those of the film formation device 1 embodied in the vapor deposition device illustrated in FIG. 1 are denoted with the same reference numerals, and the description thereof will be borrowed herein.

The film formation device 1 of the present embodiment includes a film formation chamber 2 in which at least substrates S and sputtering electrodes (not illustrated) equipped with targets are provided. The film formation chamber 2 can be set to a predetermined film formation atmosphere, specifically to a predetermined degree of vacuum. The film formation chamber 2 is provided with an evacuation device 21 via a gate valve 22. By opening the gate valve 22 to evacuate the gas inside the film formation chamber 2, the inside of the film formation chamber 2 can be set, for example, to a vacuum atmosphere suitable for a sputtering process. Although illustration is omitted, various gases such as an inert gas are supplied to the film formation chamber 2. As the degree of vacuum increases inside the film formation chamber 2, the mean free path of the sputtered target atoms increases, and the sputtering process is promoted. The evacuation device 21 and the gate valve 22 are controlled by command signals from a controller 3.

As illustrated in FIG. 8, the substrates S such as semiconductor wafers, glass substrates and plastic substrates are mounted on the side surface of a drum-shaped substrate holder 25, and the side wall of the film formation chamber 2 facing these substrates S is provided with the above-described sputtering electrodes (not illustrated). The drum-shaped substrate holder 25 is rotated at a predetermined constant speed by a holder drive unit 26 via a rotating shaft 27 connected to the upper end of the drum-shaped substrate holder 25. The holder drive unit 26 is controlled by a command signal from the controller 3.

The film formation device 1 of the present embodiment includes a film formation condition controller 4. The film formation condition controller 4 of the present embodiment specifies the position of a substrate S fixed to the rotating substrate holder 25 and continuously measures, during the film formation, the spectral characteristic of each layer constituting the thin film. When the spectral characteristic of the obtained thin film falls outside an allowable range after the completion of the film formation, the film formation condition controller 4 corrects the film formation condition (e.g., the film thickness) due to the spectral characteristic and then executes the next film formation process.

To this end, the film formation condition controller 4 of the present embodiment includes a laser sensor 48 and one or more reflective plates 251 for acquiring positional information corresponding to a position in the circumferential direction of the substrate holder 25. The laser sensor 48 and the one or more reflective plates 251 correspond to the positional information acquisition unit of the present invention. Although detailed illustration is omitted, the reflective plates 251 are provided at two locations on the outer peripheral end portion of the substrate holder 25, for example, with a phase of 180°.

The laser sensor 48, which is fixed outside the film formation chamber 2, emits laser light through an observation window 29b toward the position at which a reflective plate 251 is provided, and receives the reflected light to output the intensity of received light. The laser light emitted from the laser sensor 48 is reflected twice by the reflective plates 251 while the substrate holder 25 rotates once, and the reflection signal is input. Provided that the positions of the reflective plates 251 on the substrate holder 25 in the circumferential direction and the mounting position of each substrate S in the circumferential direction are known and the rotation speed of the substrate holder 25 rotated by the holder drive unit 26 is a constant and known value, the position of a specific substrate S can be identified from the timing at which the laser sensor 48 detects a reflective plate 251. The detection signal from the laser sensor 48 is output to an LED power source 43 and a spectroscope 46.

In order to measure the spectral characteristic of a layer formed on a substrate S during the film formation process, the film formation condition controller 4 of the present embodiment includes an LED projector 42 (corresponding to the light source of the present invention) that irradiates the substrate S with LED light. The LED light emitted from the LED light projector 42 is guided to a light projection lens unit 41 via an optical fiber 44 and projected to the substrate S mounted at a predetermined position of the substrate holder 25. The LED projector 42 emits the LED light when supplied with power from the LED power source 43, and the LED power source 43 is turned ON/OFF at predetermined timing based on the detection signal from the above-described laser sensor 48. The projection lens unit 41 is provided outside the film formation chamber 2 and emits the LED light via an observation window 29c. The substrate holder 25 and the substrates S are composed of materials through which the LED light can pass.

The film formation condition controller 4 of the present embodiment includes a spectroscope 46 (corresponding to the light receiving unit of the present invention) that receives transmitted light passing through a layer formed on a substrate S with respect to the LED light emitted from the LED light projector 42. The LED light received by the spectroscope 46 is guided by a light receiving lens unit 45 and an optical fiber 47. The light receiving lens unit 45 of the present embodiment is provided outside the film formation chamber 2 and receives the LED light through an observation window 29a. The detection signal from the laser sensor 48 is input to the spectroscope 46, which can therefore execute the light receiving process at the timing synchronized with the light emission timing of the above-described LED power source 43.

The spectroscope 46 outputs the intensity (spectrum) of each wavelength contained in the received, transmitted light, and the film thickness can be optically measured based on the spectrum. That is, the transmittance (ratio of transmission through an object) can be calculated from the ratio between the intensity of the received, transmitted light and the intensity of reference light (reference intensity), and the film thickness can be calculated from the calculated transmittance and a transmittance-film thickness relational expression that is preliminarily obtained. Here, the reference light is LED light emitted to a state in which the layer to be measured is not formed. In the same manner as in the above-described embodiment illustrated in FIG. 4, a through-hole 253 having a diameter that allows the LED light to pass through the through-hole 253 is formed at a predetermined position of the substrate holder 25, and the reference light can be received by the light receiving lens unit 45. Using this as the reference light and its intensity as the reference intensity, the transmittance is calculated.

DESCRIPTION OF REFERENCE NUMERALS

1 Film formation device
2 Film formation chamber
  21 Evacuation device
  22 Gate valve
  23 Hearth liner
  24 Heating source
  25 Substrate holder (rotating body)
  251 Reflective plate (position information acquisition unit)
  252 Notch portion
  253 Through-hole
  26 Holder drive unit
  27 Rotating shaft
  28 Film thickness correcting plate
  29a, 29b, 29c Observation window
3 Controller (film formation processing unit)
4 Film formation condition controller (control unit)
40 Film formation condition setting unit
41 Light projection lens unit
42 LED projector (light source)
43 LED power source
44 Optical fiber
45 Light receiving lens unit
46 Spectroscope
47 Optical fiber
48 Laser sensor (positional information acquisition unit)
5 Crystal oscillation-type film thickness meter
6 Optical film thickness meter M Film formation material
S Substrate

The invention claimed is:

1. A film formation control device comprising:
a light source that irradiates a substrate with light, the substrate being disposed on a rotating body;
a light receiving unit that receives transmitted light or reflected light, the transmitted light being a light emitted from the light source and transmitted through a layer of a thin film formed on the substrate, the reflected light being a light emitted from the light source and reflected by the layer;
a positional information acquisition unit that acquires positional information corresponding to a position in a circumferential direction of the rotating body; and
a control unit that controls a film formation condition,
the control unit comprising:
  a timing control unit that determines a targeted position of the substrate based on the positional information in the circumferential direction of the rotating body acquired by the positional information acquisition unit and controls timing of receiving the transmitted light or reflected light of the light emitted from the light source to the substrate at the targeted position;
  a film thickness determination unit that calculates a film thickness of each layer of the thin film composed of multiple layers based on the transmitted light or reflected light received by the light receiving unit and determines a film thickness difference between the calculated film thickness of each layer and a target film thickness of each layer constituting the thin film having a desired spectral characteristic;
  a spectral characteristic determination unit that determines whether a spectral characteristic of the thin film obtained by a film formation process falls within an allowable range of the desired spectral characteristic; and
  a film formation condition setting unit that,
wherein:
i) when the spectral characteristic of the thin film obtained by the film formation process falls within the allowable range of the desired spectral characteristic, the film formation condition setting unit does not adjust the film formation condition for each layer;
ii) when the spectral characteristic of the thin film obtained by the film formation process falls outside the allowable range of the desired spectral characteristic, determine whether the film thickness difference exceeds a predetermined value,
  ii)-1: when the film thickness difference of at least one layer is more than the predetermined value, adjusts the film formation condition for the at least one layer to be formed on a subsequent substrate so that the film thickness of each layer to be formed on the subsequent substrate becomes the target film thickness; and
  ii)-2: when the film thickness difference of the at least one layer is equal to or less than the predetermined value, the film formation condition setting unit does not adjust the film formation condition for each layer.

2. The film formation control device according to claim 1, wherein the film thickness determination unit calculates a transmittance from an intensity of the transmitted light received by the light receiving unit or calculates a reflectance from an intensity of the reflected light and calculates the film thickness of each layer from the calculated transmittance or reflectance.

3. The film formation control device according to claim 2, wherein the film thickness determination unit compares the intensity of the transmitted light or reflected light transmitted through or reflected from each layer constituting the thin film with a reference intensity to calculate the thickness of each layer, wherein the reference intensity is an intensity when the light emitted from the light source is received by the light receiving unit only through a film formation space without passing through the substrate and each layer constituting the thin film or an intensity when the light emitted from the light source is reflected only by the substrate before the film formation process and received by the light receiving unit.

4. The film formation control device according to claim 3, wherein a through-hole is formed at a concyclic position on the substrate disposed on the rotating body, and the intensity when the light emitted from the light source is transmitted through the through-hole and received by the light receiving unit is set as the reference intensity.

5. The film formation control device according to claim 1, wherein the positional information acquisition unit comprises:

a reflective plate disposed on the rotating body; and a laser device that irradiates the reflective plate with laser light and receives reflected laser light reflected from the reflective plate, and the timing control unit acquires the positional information of the rotating body from an intensity distribution of the reflected laser light received by the laser device and controls, based on the acquired positional information, a first timing at which the light source emits pulsed light and a second timing at which the light receiving unit receives the pulsed light.

6. The film formation control device according to claim 1, wherein the positional information acquisition unit comprises:

a rotating shaft that rotates together with the rotating body;

a reflective plate that is disposed on the rotating shaft and includes two notch portions;

a light projecting unit that projects light toward the reflective plate; and a projected light receiving unit that receives light from the light projecting unit, and the timing control unit acquires the positional information of the rotating body from an intensity distribution of the light received by the projected light receiving unit and controls, based on the acquired positional information, a first timing at which the light source emits pulsed light and a second timing at which the light receiving unit receives the pulsed light.

7. A film formation device comprising:

a film formation chamber that is set to a predetermined pressure and includes a rotating body on which a substrate is disposed;

a film formation processing unit that executes a film formation process for a thin film composed of multiple layers in accordance with a predetermined film formation condition; and a film formation control device according to claim 1, wherein the film formation control device sets the predetermined film formation condition for the film formation processing unit.

* * * * *